United States Patent
Chanda et al.

(10) Patent No.: US 7,732,924 B2
(45) Date of Patent: Jun. 8, 2010

(54) SEMICONDUCTOR WIRING STRUCTURES INCLUDING DIELECTRIC CAP WITHIN METAL CAP LAYER

(75) Inventors: Kaushik Chanda, Fishkill, NY (US); Ronald G. Filippi, Wappingers Falls, NY (US); Ping-Chuan Wang, Hopewell Junction, NY (US); Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 11/761,495

(22) Filed: Jun. 12, 2007

(65) Prior Publication Data

US 2008/0308942 A1 Dec. 18, 2008

(51) Int. Cl.
*H01L 23/52* (2006.01)
(52) U.S. Cl. .................. 257/761; 257/758; 257/774; 257/E23.141; 438/648
(58) Field of Classification Search ............ 257/49–52, 257/E51.005, 758, 774, E29.151, 761, E23.141, 257/E21.495, E21.493; 438/648
See application file for complete search history.

(56) References Cited

U.S. PATENT DOCUMENTS

| | | | |
|---|---|---|---|
| 5,585,673 A | 12/1996 | Joshi et al. | |
| 5,695,810 A | 12/1997 | Dubin et al. | |
| 6,323,554 B1 | 11/2001 | Joshi et al. | |
| 6,342,733 B1 | 1/2002 | Hu et al. | |
| 6,383,920 B1 | 5/2002 | Wang et al. | |
| 6,635,496 B2 * | 10/2003 | Ning | 438/3 |
| 2004/0113279 A1 | 6/2004 | Chen et al. | |

OTHER PUBLICATIONS

Hu et al., "Effect of metal liner on electromigration in Cu Damascene lines," Journal of Applied Physics 98, 124501, 2005, pp. 124501-1-124501-8.
Hu et al., "Comparison of Cu electromigration lifetime in Cu Interconnects coated with various caps," Applied Physics Letters, vol. 83, No. 5, Aug. 4, 2003, pp. 869-871.

* cited by examiner

*Primary Examiner*—Thinh T Nguyen
(74) *Attorney, Agent, or Firm*—Ian D. MacKinnon; Hoffman Warnick LLC

(57) ABSTRACT

Semiconductor wiring structures including a dielectric layer having a metal wiring line therein, a via extending downwardly from the metal wiring line, a metal cap layer over the metal wiring line, and a local dielectric cap positioned within a portion of the metal cap layer and in contact with the metal wiring line and a related method are disclosed. The local dielectric cap represents an intentionally created weak point in the metal wiring line of a dual-damascene interconnect, which induces electromigration (EM) voiding in the line, rather than at the bottom of a via extending downwardly from the metal wiring line. Since the critical void size in line fails, especially with metal cap layer (liner) redundancy, is much larger than that in via fails, the EM lifetime can be significantly increased.

7 Claims, 2 Drawing Sheets

SEMICONDUCTOR WIRING STRUCTURES INCLUDING DIELECTRIC CAP WITHIN METAL CAP LAYER

BACKGROUND

1. Technical Field

The disclosure relates generally to integrated circuit (IC) chip fabrication, and more particularly, to semiconductor wiring structures including a local dielectric cap within a metal cap layer.

2. Background Art

In the integrated circuit (IC) chip fabrication industry, electromigration (EM) induced failure in interconnects is a major concern for advanced back-end-of-line (BEOL) technology. Early EM induced failure, in particular, significantly reduces the projected current limit of product chip under operating conditions. EM induced failure, particularly in interconnects fabricated using a dual-damascene process, may take the form of "line-fails" or "via fails." The arrow in FIG. 1A shows the electron current flow and the EM flux. It is well known that, in a dual-damascene interconnect, an electron current flowing from via 10 into a line 32 above can induce EM damage in either via 10 and/or line 32, causing via voiding 14 or line voiding 30, respectively, as shown in FIG. 1B. Via voiding 14 results in very early fail under EM conditions during circuit operation, since it takes only a very small void 14 at the bottom of via 10 to cause an open circuit and failure in such a case. Line voiding 30, on the other hand, results in late fails, since the associated void size required to cause an electrical open is significantly larger.

SUMMARY

Semiconductor wiring structures including a dielectric layer having a metal wiring line therein, a via extending downwardly from the metal wiring line, a metal cap layer over the metal wiring line, and a local dielectric cap positioned within a portion of the metal cap layer and in contact with the metal wiring line and a related method are disclosed. The local dielectric cap represents an intentionally created weak point in the metal wiring line of a dual-damascene interconnect, which induces electromigration (EM) voiding in the line, rather than at the bottom of a via extending downwardly from the metal wiring line. Since the critical void size in line fails, especially with metal cap layer (liner) redundancy, is much larger than that in via fails, the EM lifetime can be significantly increased.

A first aspect of the disclosure provides a semiconductor wiring structure comprising: a dielectric layer having a metal wiring line therein; a via extending downwardly from the metal wiring line; a metal cap layer over the entire metal wiring line; and a local dielectric cap positioned within a portion of the metal cap layer and in contact with the metal wiring line.

A second aspect of the disclosure provides a semiconductor wiring structure comprising: a dielectric layer having a metal wiring line therein; a metal cap layer over the entire metal wiring line, the metal cap layer being continuous over the metal wiring line except for at a predetermined open portion; a local dielectric cap positioned within the predetermined open portion of the cap layer, wherein the predetermined open portion is positioned over a via extending downwardly from the metal wiring line.

A third aspect of the disclosure provides a method comprising: providing a dual damascene interconnect including a dielectric layer having a first metal wiring line therein and a via extending downwardly to a second metal wiring line, at least the first metal wiring line including a metal cap layer extending thereover; and intentionally creating a weak point in the metal cap layer of the first metal wiring line to promote any electromigration voiding in the first metal wiring line rather than in the via.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 4:
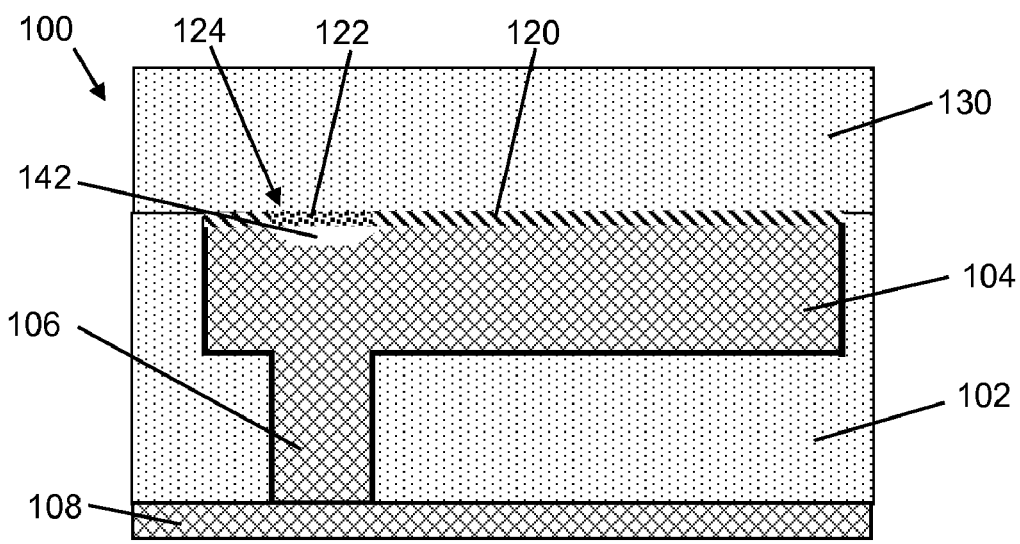

Referring to FIG. 4, embodiments of a semiconductor wiring structure 100 and a related method are shown. Semiconductor wiring structure 100 includes a dielectric layer 102 having a metal wiring line 104 therein. Dielectric layer 102 may include but is not limited to: silicon nitride ($Si_3N_4$), silicon oxide ($SiO_2$), fluorinated $SiO_2$ (FSG), hydrogenated silicon oxycarbide (SiCOH), porous SiCOH, boro-phosphosilicate glass (BPSG), silicon oxide, silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available from JSR Corporation), other low dielectric constant (<3.9) material, or layers thereof.

A via 106 extends downwardly from metal wiring line 104 to another metal wiring line 108. Metal wiring lines 104, 108 and via 106 may include any now known or later developed metal material such as copper (Cu), aluminum (Al), gold (Au), silver (Ag), or alloys thereof. Metal wiring line 104 and via 106 may include a liner 110 (dark line) (FIG. 2 only) forming an outer surface thereof.

A metal cap layer 120 extends over metal wiring line 104. A local dielectric cap 122 is positioned within a predetermined portion 124 of metal cap layer 120 and is in contact with metal wiring line 104. That is, metal cap layer 120 is continuous over metal wiring line 104 except for predetermined portion 124. Local dielectric cap 122 may be positioned in an area over via 106 or nearby an area over via 106, e.g., overlapping at least some part of via 106. In one embodiment, metal cap layer 120 may include a material such as: tantalum (Ta), ruthenium (Ru), cobalt-tungsten-phosphorus (CoWP) and alloys thereof. Local dielectric cap 122 may include a material such as: silicon nitride ($Si_3N_4$), silicon carbide (SiC) or silicon carbon (N, H). Another dielectric layer 130 similar to dielectric layer 102 may be provided over structure 100.

Semiconductor wiring structure 100 takes advantage of the fact that the top interface of a dual-damascene interconnect is the main diffusion path during EM processes. In particular, structure 100 provides an intentional weak point, i.e., portion 124 filled by dielectric cap 122, in metal wiring line 104, which promotes any electromigration voiding 142 (FIG. 4) in first metal wiring line 104 rather than in via 106, i.e., at a bottom of via 106. Because the critical void size in line-fails (especially with cap layer 120 and liner 110 redundancy) is much larger than that in via-fails, the EM lifetime can be significantly increased by employing structure 100. Note that, by implementing this weak point, the lifetime of the main failure distribution may be expected to be somewhat reduced by a time needed to nucleate line voids during EM, i.e., t_nucleation. However, it has been reported that the nucleation time in copper interconnects is significantly shorter than their electromigration lifetime. Therefore, the overall electromigration lifetime associated with line-voiding in the disclosed wiring structure 100 extends higher than structures exhibiting early via-voiding.

Figure 1A:
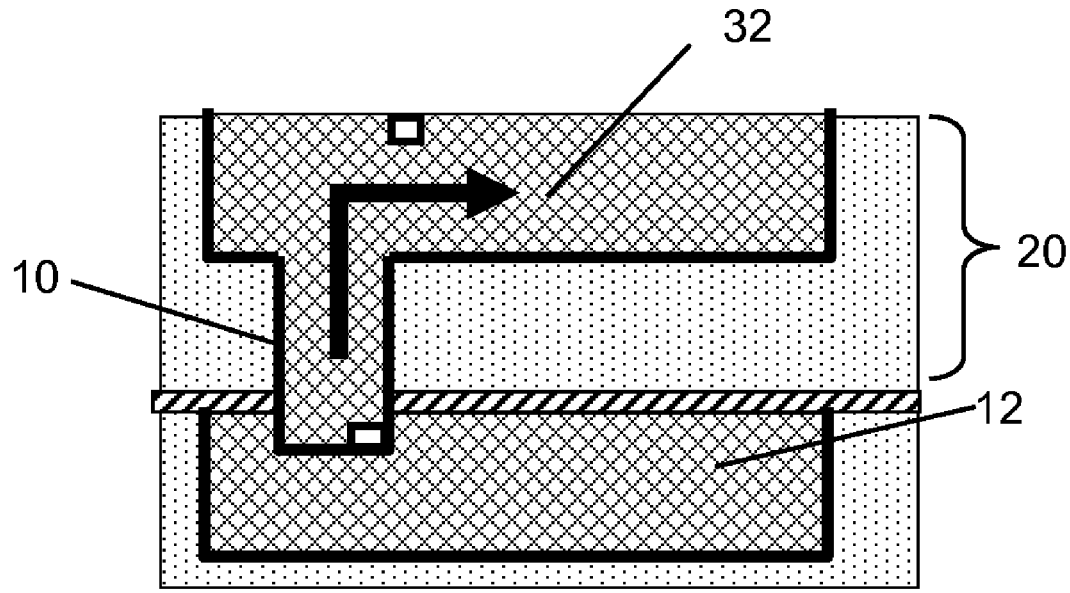
FIGS. 1A-B show a conventional via and metal wire interface in which electromigration causes a failure.
Figure 1B:
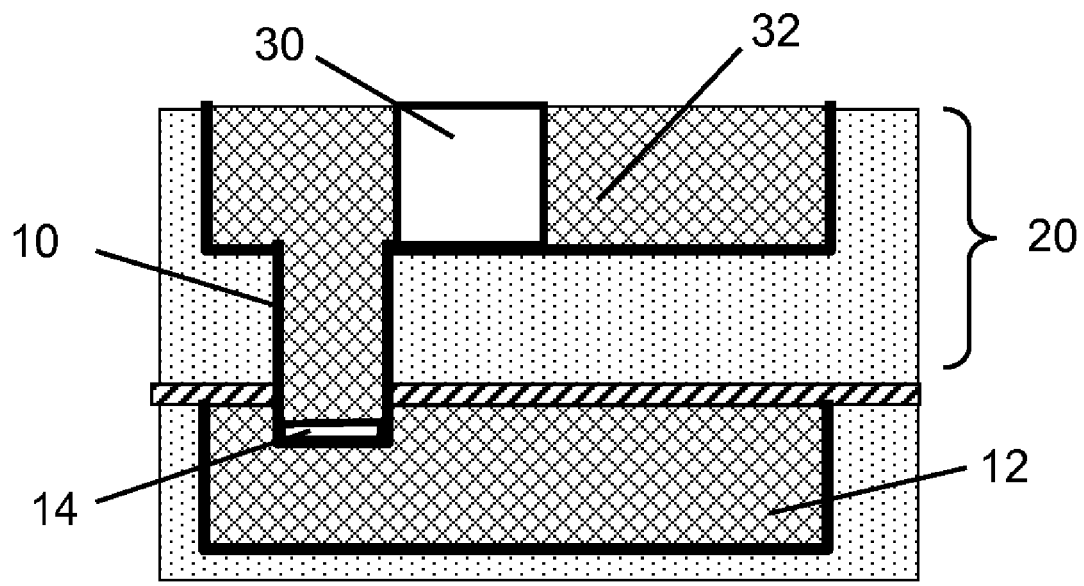
Figure 2:
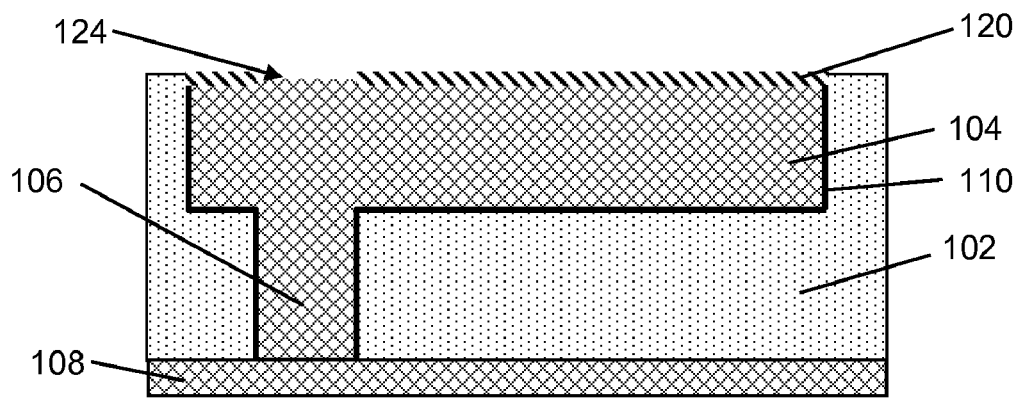
FIGS. 2-4 show embodiments of a method of forming a semiconductor wiring structure according to the disclosure, with FIG. 4 showing embodiments of the structure according to the disclosure.
Figure 3:
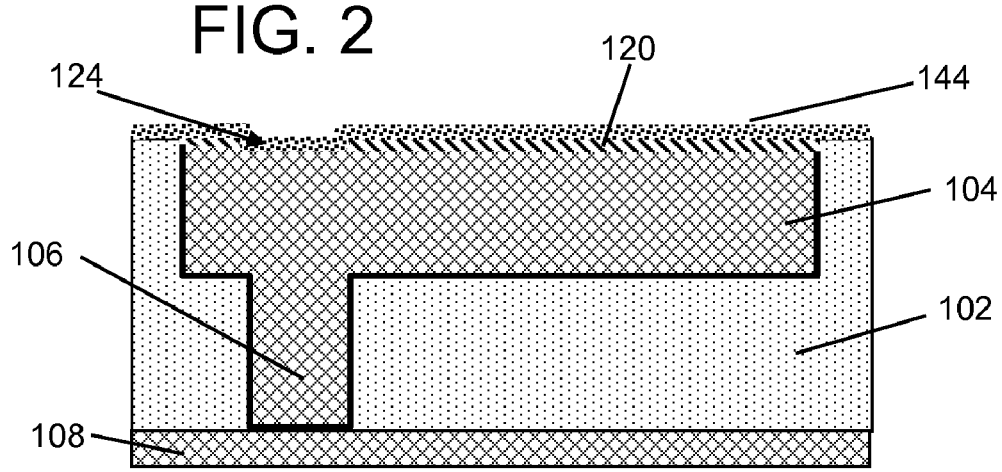

Referring to FIGS. 2-4, embodiments of a method of fabricating semiconductor wiring structure 100 will now be described. A first process includes, as shown in FIG. 2, providing a dual damascene interconnect including dielectric layer 102 having first metal wiring line 104 therein and via 106 extending downwardly to second metal wiring line 108. This structure may be formed using any now known or later developed dual damascene techniques, e.g., dielectric deposition, photoresist patterning, etching, further dielectric deposition, patterning and etching, and finally, metal deposition and planarization, etc. At least first metal wiring line 104 includes metal cap layer 120 extending thereover, which may be formed by any appropriate deposition technique. As shown in FIGS. 2-3, the weak point, i.e., portion 124 filled by dielectric cap 122 (FIG. 4), is intentionally created in metal cap layer 120 of first metal wiring line 104 to promote any electromigration voiding 142 (FIG. 4) in first metal wiring line 104 rather than in via 106. In one example, a via mask (not shown) may be used to etch metal cap layer 120, as shown in FIG. 2, such that no additional mask is required for creating dielectric cap 122. However, where portion 124 is not positioned directly over via 106, other masks may be required. As shown in FIGS. 3-4, local dielectric cap 122 material 144 may then be deposited using any appropriate technique and then planarized. Another dielectric layer 130 may be formed thereover, as shown in FIG. 4.

The methods and structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A semiconductor wiring structure comprising:
   a dielectric layer having a metal wiring line therein;
   a via extending downwardly from the metal wiring line;
   a metal cap layer over the metal wiring line; and
   a local dielectric cap positioned within a portion of the metal cap layer and in contact with the metal wiring line, wherein the local dielectric cap is positioned in an area overlapping at least a portion of the via.

2. The semiconductor wiring structure of claim 1, wherein the metal cap layer is continuous over the metal wiring line except for the portion.

3. The semiconductor wiring structure of claim 1, wherein the metal cap layer includes a material selected from the group consisting of: tantalum (Ta), ruthenium (Ru), cobalt-tungsten-phosphorus (CoWP) and alloys thereof.

4. The semiconductor wiring structure of claim 1, wherein the local dielectric cap includes a material selected from the group consisting of: silicon nitride ($Si_3N_4$), silicon carbide (SiC) and silicon carbon (N, H).

5. A semiconductor wiring structure comprising:
   a dielectric layer having a metal wiring line therein;
   a metal cap layer over the metal wiring line, the metal cap layer being continuous over the metal wiring line except for at a predetermined open portion; and
   a local dielectric cap positioned within the predetermined open portion of the metal cap layer,
   wherein the predetermined open portion is positioned over a via extending downwardly from the metal wiring line, and wherein the local dielectric cap is positioned in an area overlapping at least a portion of the via.

6. The semiconductor wiring structure of claim 5, wherein the metal cap layer includes a material selected from the group consisting of: tantalum (Ta), ruthenium (Ru), cobalt-tungsten-phosphorus (CoWP) and alloys thereof.

7. The semiconductor wiring structure of claim 5, wherein the local dielectric cap includes a material selected from the group consisting of: silicon nitride ($Si_3N_4$), silicon carbide (SiC) and silicon carbon (N, H).

* * * * *